United States Patent
Schurr et al.

(10) Patent No.: US 10,401,437 B2
(45) Date of Patent: Sep. 3, 2019

(54) CIRCUIT ARRANGEMENT FOR DETERMINING THE CELL VOLTAGE OF AN INDIVIDUAL CELL IN A CELL GROUPING

(71) Applicant: Andreas Stihl AG & Co. KG, Waiblingen (DE)

(72) Inventors: Martin Schurr, Mutlangen (DE); Gernot Liebhard, Waiblingen (DE); Christian Heigemeyr, Egweil (DE); Markus Kulzer, Eitensheim (DE)

(73) Assignee: Andreas Stihl AG & Co. KG, Waiblingen (DE)

( * ) Notice: Subject to any disclaimer, the term of this patent is extended or adjusted under 35 U.S.C. 154(b) by 187 days.

(21) Appl. No.: 15/419,752

(22) Filed: Jan. 30, 2017

(65) Prior Publication Data

US 2017/0219658 A1    Aug. 3, 2017

(30) Foreign Application Priority Data

Jan. 30, 2016    (DE) .................. 10 2016 001 057

(51) Int. Cl.
| | |
|---|---|
| *G01R 31/02* | (2006.01) |
| *G01R 31/396* | (2019.01) |
| *G01R 31/367* | (2019.01) |
| *G01R 19/165* | (2006.01) |
| *G01R 31/3835* | (2019.01) |

(52) U.S. Cl.
CPC ..... *G01R 31/396* (2019.01); *G01R 19/16542* (2013.01); *G01R 31/367* (2019.01); *G01R 31/3835* (2019.01)

(58) Field of Classification Search
USPC .................. 324/434, 433; 320/155, 157
See application file for complete search history.

(56) References Cited

U.S. PATENT DOCUMENTS

| | | | |
|---|---|---|---|
| 6,803,766 B2 | 10/2004 | Kobayashi et al. | |
| 7,772,803 B2 | 8/2010 | Jaeger et al. | |
| 8,058,847 B2 | 11/2011 | Jaeger et al. | |
| 8,242,746 B2 | 8/2012 | Austerschulte | |
| 2010/0271035 A1* | 10/2010 | Heo ..................... | G01R 31/362 324/429 |

FOREIGN PATENT DOCUMENTS

| | | |
|---|---|---|
| DE | 102014204959 A1 | 9/2015 |
| FR | 3039006 A1 | 1/2017 |
| JP | 2002286766 A | 10/2002 |

* cited by examiner

*Primary Examiner* — Vincent Q Nguyen
(74) *Attorney, Agent, or Firm* — Walter Ottesen, P.A.

(57) ABSTRACT

A circuit arrangement is for determining the cell voltage of an individual cell in a cell grouping of a series circuit of individual cells of an accumulator pack. Potential points are formed between electrically adjacent individual cells of the series circuit. The potentials of the potential points which follow one another in the series circuit increase in absolute value starting from a reference potential. Each potential point is connected to a measuring input of an evaluation device via a measuring resistor and a switch. In order to measure the cell voltage of an individual cell, the measuring input is connected to the reference potential via a capacitor. The evaluation device registers the charging time of the capacitor to a predefined voltage. On the basis of the registered charging time, the evaluation device determines the cell voltage of the measured individual cell.

12 Claims, 2 Drawing Sheets

CIRCUIT ARRANGEMENT FOR DETERMINING THE CELL VOLTAGE OF AN INDIVIDUAL CELL IN A CELL GROUPING

CROSS REFERENCE TO RELATED APPLICATION

This application claims priority of German patent application no. 10 2016 001 057.6, filed Jan. 30, 2016, the entire content of which is incorporated herein by reference.

BACKGROUND OF THE INVENTION

U.S. Pat. No. 8,242,746 discloses a circuit arrangement for measuring the cell voltages of individual cells of an accumulator pack. The individual cells form a cell grouping composed of a series circuit of individual cells, wherein potential points are formed between electrically adjacent individual cells of the series circuit. The potentials of the potential points which follow one another in the series circuit increase in absolute value from a reference potential. Each potential point of the series circuit is connected to a measuring input of an evaluation device via a measuring resistor and a switch. At the measuring resistor, a voltage drops after the closing of the switch and is registered by the evaluation device. The measuring resistors which are assigned to a potential point are connected in series in the manner of a resistor cascade and form an ohmic load of the individual cells to be measured. In this context, when the first individual cell of the series circuit is measured, the closed switch and the first measuring resistor form, with the first individual cell, a first electrical measuring circuit. If the second switch is closed—or all the other switches are open—the first individual cell, the second individual cell, the first measuring resistor and the second measuring resistor form a closed measuring circuit. An individual cell is electrically loaded with each measurement, wherein the loading of the first individual cells of a series circuit is greater than that of the last individual cells of the series circuit. The individual cells are respectively measured by closing the individual switches, wherein in each case the voltage which drops at the measuring resistor is registered and evaluated.

The expenditure involved with such a circuit arrangement for measuring individual voltages is high; since the measuring voltages are registered under ohmic load, the individual cells are subject to heavy electrical loading, which can influence the service life of the accumulator pack.

SUMMARY OF THE INVENTION

It is an object of the invention to provide a circuit arrangement for determining the cell voltage of an individual cell in a cell grouping of a series circuit of individual cells of an accumulator pack, which series circuit is of simple configuration and has low electrical loading of the individual cells during the measurement.

The object can, for example, be achieved by a circuit arrangement for determining a cell voltage of an individual cell in a cell grouping. The circuit arrangement includes: a series circuit having a plurality of individual cells of a battery pack; the plurality of individual cells being arranged in series starting at a reference potential; mutually adjacent ones of the plurality of individual cells having respective potential points therebetween; successive ones of the potential points having respective successively increasing absolute potentials with respect to the reference potential; an evaluation unit having a measurement input; each of the potential points being connected to the measurement input of the evaluation unit via a respective measurement resistance and a respective switch; a measurement capacitor; the measurement input being connected to the reference potential via the measurement capacitor; the evaluation unit being configured to determine a load time $t_i$ of the measurement capacitor to a predetermined measurement voltage; and, the evaluation unit being further configured to determine the cell voltage of a respective one of the individual cells on the basis of the load time $t_i$.

The measuring input of the evaluation device is connected to the reference potential via a capacitor, wherein the evaluation device registers the charging time of the capacitor to a defined measuring voltage. The evaluation device determines the cell voltage of the measured individual cell on the basis of the charging time of the measuring capacitor.

The charging time of the measuring capacitor to the measuring voltage is advantageously easily registered by means of a counter which starts when the measurement starts and stops when the predefined measuring voltage is reached. The counter easily registers the charging time of the measuring capacitor directly in counting units wherein a large quantity of counting units is preferably selected. It is therefore possible, for example, to configure the point where the measuring voltage is reached with a counter reading of several thousand or tens of thousands of counting units, which permits a high resolution without large technical expenditure. In comparison with known A/D converters it is therefore possible to achieve a high level of accuracy.

The counter reading of the counter is proportional to the charging time of the measuring capacitor to the measuring voltage. In this context, the counting unit of the counter can correspond to a predefined fixed time unit. The counter easily counts the pulses of a timing element.

The capacitor voltage of the measuring capacitor is connected to a first input of a comparator, to the second input of which a reference value corresponding to the predefined measuring voltage is applied. The output of the comparator can easily be connected as a control signal to the counter. The output of the comparator starts and stops the counter.

The evaluation device for converting the counter reading into the cell voltage of the measured individual cell is advantageously embodied in a microprocessor. The counter can also be embodied as an integrated component in this microprocessor. The comparator is expediently an integrated part of the microprocessor. The timing element is formed by the "clock" of the microprocessor, the pulse sequence of which is counted by the counter.

The predefined measuring voltage is advantageously lower, in particular 10% to 95% lower than the cell voltage of a completely charged individual cell, with the result that the electrical loading of the individual cell during the measuring process is low. If the cell voltage of an individual cell in the charged state is approximately 4.2 volts, the predefined measuring voltage can be, for example, only 2000 mV. The predefined measuring voltage, which is also used as a reference value for comparison, is advantageously 1000 mV.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
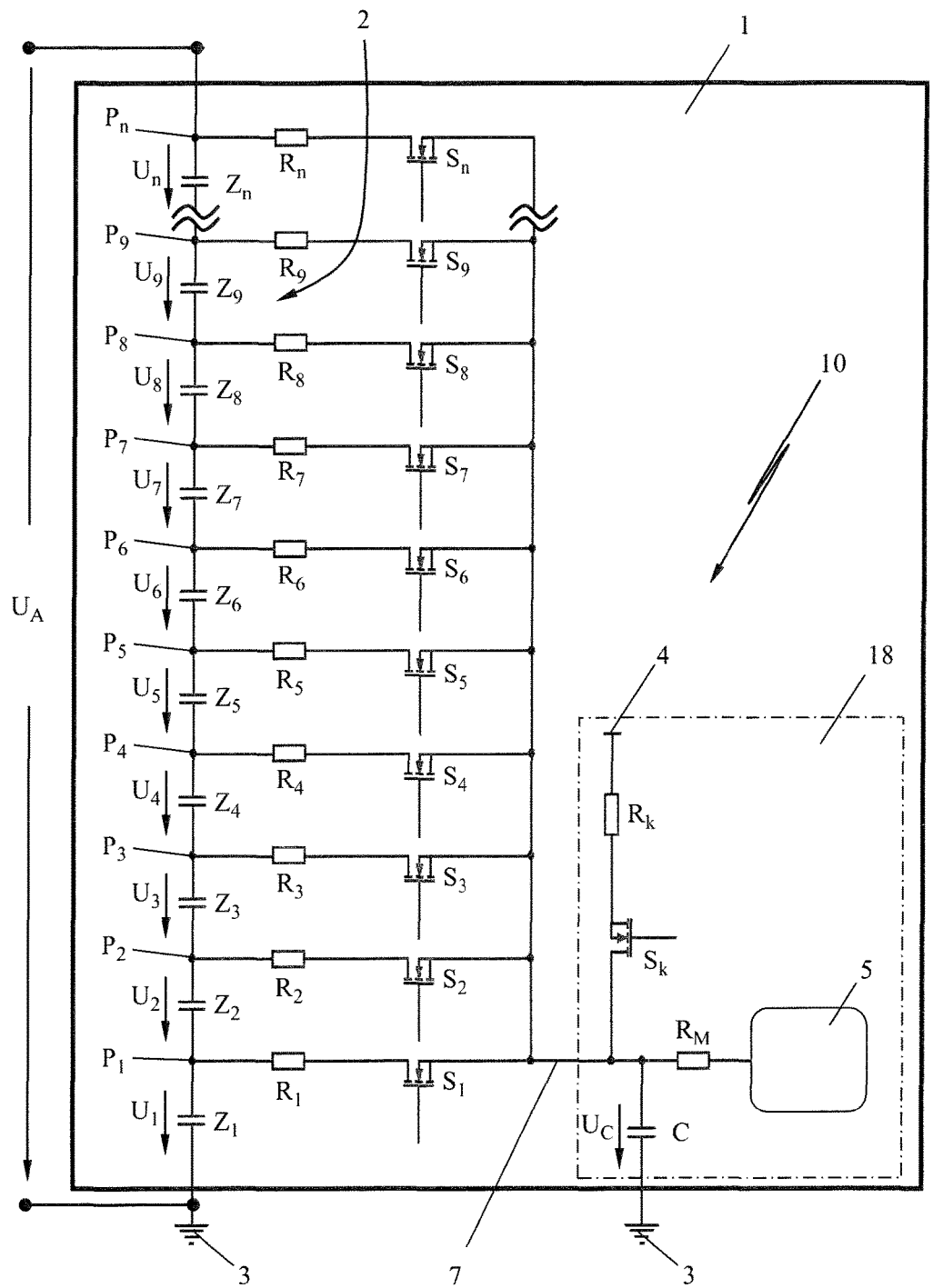
FIG. 1 shows a schematic illustration of a circuit arrangement for determining the cell voltage of an individual cell in a cell grouping.
Figure 2:
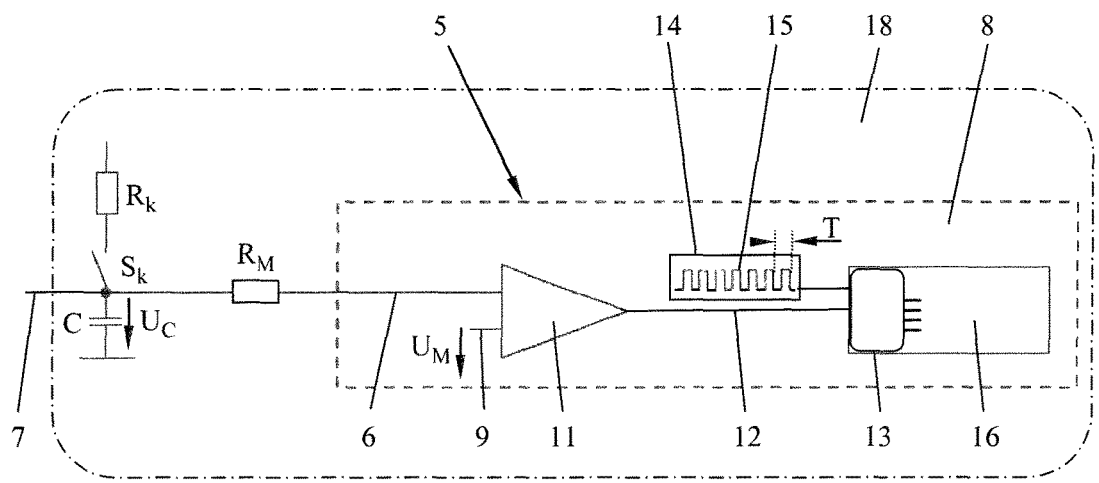
FIG. 2 shows a schematic illustration of a block circuit diagram of an evaluation device; and, FIG. 3 shows a schematic illustration of the voltage profile of the capacitor voltage of the measuring capacitor.

FIG. 1 represents schematically an embodiment of a circuit arrangement 10 of individual cells $Z_1$, $Z_2$, $Z_3$, $Z_4$, $Z_5$, $Z_6$, $Z_7$, $Z_8$, $Z_9$ to $Z_n$ within an accumulator pack 1. The individual cells $Z_1$ to $Z_n$ are connected in series in a series circuit 2 and together make available as a total voltage an accumulator pack voltage $U_A$. The accumulator pack voltage $U_A$ is composed of the individual voltages $U_1$, $U_2$, $U_3$, $U_4$, $U_5$, $U_6$, $U_7$, $U_8$, $U_9$ to $U_n$. The individual cells $Z_1$ to $Z_n$ form a cell grouping of the accumulator pack.

The series circuit 2 has, after each individual cell $Z_1$ to $Z_n$, a potential point $P_1$, $P_2$, $P_3$, $P_4$, $P_5$, $P_6$, $P_7$, $P_8$, $P_9$ to $P_n$, wherein—as can be seen at the voltage arrows $U_1$ to $U_n$—the potentials of the potential points $P_1$ to $P_n$ which follow one another in the series circuit 2 increase from a reference potential 3. The reference potential 3 is preferably the ground potential.

Each potential point $P_1$ to $P_n$ is connected to a measuring input 7 of an evaluation device 5 via a measuring resistor $R_1$, $R_2$, $R_3$, $R_4$, $R_5$, $R_6$, $R_7$, $R_8$, $R_9$ to $R_n$ and a switch $S_1$, $S_2$, $S_3$, $S_4$, $S_5$, $S_6$, $S_7$, $S_8$, $S_9$ to $S_n$.

In the text which follows, the reference symbols $Z_i$, $P_i$, $U_i$, $S_i$, $R_i$ are generally used with the index i for the reference symbols $Z_1$, $Z_2$, ... $Z_n$, $P_1$, $P_2$, ... $P_n$, $U_1$, $U_2$, ... $U_n$, $S_1$, $S_2$, ... $S_n$, $R_1$, $R_2$, ... $R_n$, where i stands for a natural number from 1 to n. For example, $Z_i$ is therefore defined as ($Z_i$) where i=1, 2, 3, ... n.

On the basis of the illustrated circuit arrangement 10, when, for example, the switch $S_7$ closes the individual voltages $U_1$, $U_2$, $U_3$, $U_4$, $U_5$, $U_6$ and $U_7$ of the partial series circuit of the individual cells $Z_1$, $Z_2$, $Z_3$, $Z_4$, $Z_5$, $Z_6$ and $Z_7$ are present as a total voltage at the capacitor C. In order to be able to tap comparable measurement results at the capacitor C independently of the selected switch $S_i$, the measuring resistors $R_1$, $R_2$, $R_3$, $R_4$, $R_5$, $R_6$, $R_7$, $R_8$, $R_9$ to $R_n$ are selected adapted in terms of their magnitude. Therefore, for the first resistor $R_1$, for example, a value of 10 kΩ is selected; the following measuring resistors $R_2$, $R_3$, $R_4$, $R_5$, $R_6$, $R_7$, $R_8$, $R_9$ to $R_n$ are embodied with increasing values; in the case of ten measuring resistors $R_n$ the last measuring resistor Rn has a value of, for example, 100 kΩ. In this way, the electrical conditions for the measurement of an individual voltage $U_i$ at an individual cell $Z_i$ are adapted as a function of the closed switch $S_i$. Each active measuring branch can therefore be calibrated statically with τ=R*C.

The measuring input 7 of the evaluation device 5 is connected via a capacitor C to the reference potential 3. The positive terminal of the capacitor C is connected to a calibrating voltage 4 via a switch $S_K$ and an ohmic resistor $R_K$.

It can be expedient to provide the evaluation device 5 with a second measuring input and a second measuring capacitor, as a result of which the total duration of the measurement of all, for example, ten individual cells can be reduced. It is therefore possible in the case of relatively large accumulators with arrangements of a relatively large number of individual cells to make available sufficient measuring arrangements which ensure reliable electrical monitoring.

Each measuring input is calibrated individually together with the assigned measuring capacitor C, and the values of the calibration are advantageously stored in a microprocessor 8. Dynamic calibration advantageously takes place in such a way that after each measurement a calibration process is run through, with the result that aging or a temperature drift of the measuring capacitor C is compensated.

The capacitor voltage $U_C$ which is to be tapped between the reference potential 3 and the measuring input 7 is fed to a microprocessor 8 via an input resistor $R_M$.

The capacitor voltage $U_C$ is connected to a first input 6 of a comparator 11. A reference value in the form of a predefined measuring voltage $U_M$ is present at the other, second input 9 of the comparator.

The output 12 of the comparator controls a counter 13 which counts the pulses 15 of a timing element 14. In a calculation unit 16, to which the counter reading of the counter 13 is transferred directly, the charging time (t) of the capacitor C to the measuring voltage $U_M$ which is predefined as a reference voltage is determined on the basis of the counted pulses 15. The microprocessor 8 can infer the cell voltage $U_i$ of the measured individual cell $Z_i$ on the basis of the charging time $t_i$.

If, for example, the cell $Z_1$ is connected to the measuring capacitor C by closing the switch $S_1$, when the switch $S_1$ closes the counter 13 is started. On the one hand, the capacitor voltage $U_C$ is present at the comparator 11; the measuring value $U_M$ is present as a reference voltage at the other input 9 of the comparator. During the charging of the capacitor C, the counter 13 counts the pulses 15 of the timing element 14. As soon as the capacitor voltage $U_C$ reaches the reference value of the measuring voltage $U_M$, the counter 13 is stopped via the output 12 of the comparator 11. The counter reading is proportional to a time—here the charging time $t_1$—since the counter reading corresponds to a number of pulses 15 of the timing element 14. Standardized charging of the capacitor is implemented.

Figure 3:
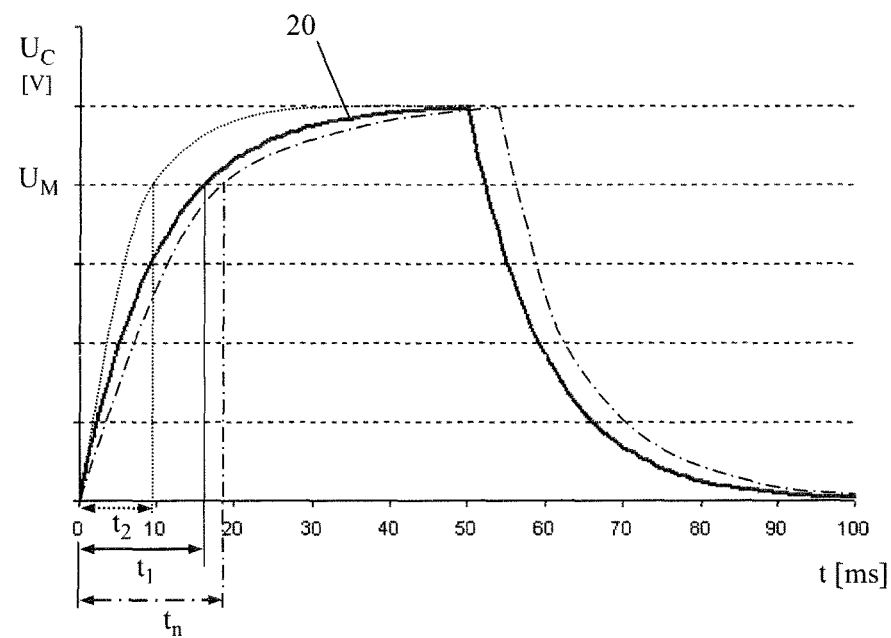

FIG. 3 represents schematically the charging of the measuring capacitor C by way of example for various charging curves 20. As illustrated, the measuring voltage $U_M$ is below a maximum charging voltage of the capacitor C; for the registration of the cell voltage $U_i$ of an individual cell $Z_i$ it is sufficient to consider a sub-branch of the charging curve 20 of the measuring capacitor C. The charging time $t_i$ which is required to charge the measuring capacitor C to the measuring voltage $U_M$ can be determined by means of the counter reading of the counter 13. The evaluation device 5 therefore determines the cell voltage $U_1$ of the measured individual cell $Z_1$, for example, on the basis of the charging time $t_1$ determined by means of the counter 13.

Since the timing element 14 makes available a pulse sequence of pulses 15 which is stable over time, a counting unit of the counter 13 corresponds to a predefined fixed time unit, specifically a period T of the pulses 15. If a pulse sequence with a high frequency is selected, a large number of pulses 15 is selected by the counter 13, as a result of which with simple configuration a high resolution and a high degree of accuracy can be achieved. Counter readings of several thousands, tens of thousands or hundreds of thousands of units can be achieved depending on the selected frequency and the pulse frequency. A high level of accuracy can therefore be achieved with low expenditure, which level of accuracy is virtually impossible to this quality level with an A/D converter with an acceptable level of expenditure.

The evaluation device 5 for converting the counter reading of the counter 13 into the cell voltage $U_i$ of the measured individual cell $Z_i$ is embodied in a microprocessor 8. Here, the counter 13 forms an integrated component of the microprocessor 8. In the same way, the comparator 11 also forms an integrated component of the microprocessor 8.

It is understood that the foregoing description is that of the preferred embodiments of the invention and that various changes and modifications may be made thereto without departing from the spirit and scope of the invention as defined in the appended claims.

What is claimed is:

1. A circuit arrangement for determining a cell voltage of an individual cell in a cell grouping, the circuit arrangement comprising:
    a series circuit having a plurality of individual cells of a battery pack;
    said plurality of individual cells being arranged in series starting at a reference potential;
    mutually adjacent ones of said plurality of individual cells having respective potential points therebetween;
    successive ones of said potential points having respective successively increasing absolute potentials with respect to said reference potential;
    an evaluation unit having a measurement input;
    each of said potential points being connected to said measurement input of said evaluation unit via a respective measurement resistance and a respective switch;
    said measurement resistances including a first measurement resistance;
    said potential points including a first potential point connected with said first measurement resistance to said measurement input and successive ones of said potential points each being connected to said measurement input via measurement resistances of increasing value;
    a measurement capacitor;
    said measurement input being connected to said reference potential via said measurement capacitor;
    wherein the increasing values of said measurement resistances are selected such that comparable measurement values can be tapped at said measurement capacitor independently of said respective switch selected;
    said evaluation unit being configured to determine a load time $t_i$ of said measurement capacitor to a predetermined measurement voltage; and,
    said evaluation unit being further configured to determine the cell voltage of a respective one of said individual cells on the basis of said load time $t_i$.

2. The circuit arrangement of claim 1, wherein said measurement voltage is less than the cell voltage of the individual cell.

3. A circuit arrangement for determining a cell voltage of an individual cell in a cell grouping, the circuit arrangement comprising:
    a series circuit having a plurality of individual cells of a battery pack;
    said plurality of individual cells being arranged in series starting at a reference potential;
    mutually adjacent ones of said plurality of individual cells having respective potential points therebetween;
    successive ones of said potential points having respective successively increasing absolute potentials with respect to said reference potential;
    an evaluation unit having a measurement input;
    each of said potential points being connected to said measurement input of said evaluation unit via a respective measurement resistance and a respective switch;
    a measurement capacitor;
    said measurement input being connected to said reference potential via said measurement capacitor;
    said evaluation unit being configured to determine a load time $t_i$ of said measurement capacitor to a predetermined measurement voltage;
    said evaluation unit being further configured to determine the cell voltage of a respective one of said individual cells on the basis of said load time $t_i$; and
    wherein said load time $t_i$ of said measurement capacitor to the measurement voltage is determined via a counter configured to start at the beginning of a measurement and to stop when the predetermined measurement voltage is reached.

4. The circuit arrangement of claim 3, wherein said counter has a counter status; and, said counter status is configured to be proportional to the load time $t_i$ of said measurement capacitor to said measurement voltage.

5. The circuit arrangement of claim 4, wherein said counter defines counter units corresponding to a predetermined time unit.

6. The circuit arrangement of claim 5, wherein said counter is configured to count pulses of a timing element.

7. The circuit arrangement of claim 3 further comprising:
    a comparator having a first comparator input and a second comparator input;
    said measurement capacitor having a measurement capacitor voltage applied to said first comparator input; and,
    said second comparator input having a reference value corresponding to said predetermined measurement voltage applied thereto.

8. The circuit arrangement of claim 7, wherein said comparator has an output applied to said counter as a control signal.

9. The circuit arrangement of claim 8, wherein said comparator for comparing said measurement capacitor voltage with said reference value is formed as an integral component of a microprocessor.

10. The circuit arrangement of claim 3, wherein:
    said counter has a counter status; and,
    said evaluation unit is formed in a microprocessor and is configured to convert said counter status into a cell voltage of the individual cell being measured.

11. The circuit arrangement of claim 10, wherein said counter is an integral component of said microprocessor.

12. The circuit arrangement of claim 11, wherein said microprocessor includes an internal clock configured to output a clock pulse; and, said counter is configured to count said clock pulse outputted by said internal clock.

* * * * *